(12) United States Patent
Lee et al.

(10) Patent No.: US 7,927,702 B2
(45) Date of Patent: Apr. 19, 2011

(54) FLAT PANEL DISPLAY DEVICE AND MANUFACTURING METHOD FOR THE SAME

(75) Inventors: Young-gu Lee, Suwon-si (KR); Sung-kee Kang, Seongnam-si (KR); Jung-woo Kim, Yongin-si (KR); Ho-nyeon Lee, Seongnam-si (KR); Ick-hwan Ko, Seoul (KR); Young-tea Chun, Suwon-si (KR); Mi-jeong Song, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1112 days.

(21) Appl. No.: 11/669,652

(22) Filed: Jan. 31, 2007

(65) Prior Publication Data
US 2007/0184292 A1    Aug. 9, 2007

(30) Foreign Application Priority Data
Feb. 3, 2006  (KR) ........................ 10-2006-0010592

(51) Int. Cl.
*B32B 9/04*   (2006.01)
*G09G 3/00*   (2006.01)

(52) U.S. Cl. ........................................ 428/411.1; 345/30
(58) Field of Classification Search .................. None
See application file for complete search history.

(56) References Cited

U.S. PATENT DOCUMENTS 6,268,695 B1 *   7/2001   Affinito ........................ 313/504
* cited by examiner

*Primary Examiner* — Sheeba Ahmed
(74) *Attorney, Agent, or Firm* — Cantor Colburn LLP

(57) ABSTRACT

A flat panel display device comprises a substrate, an organic light emitting diode formed on the substrate, an inner stack encapsulating the light emitting diode and comprising at least one organic layer and one inorganic layer, and an outer stack deposited to cover the inner stack and comprising at least two polymer layers and an adhesive and bonding layer disposed therebetween to combine the at least two polymer layers and a polymer heat-curing film disposed at an interface of each of the polymer layers and the adhesive and bonding layer and cured by heat treatment. According to the present invention, the flat panel display device and a manufacturing method for the same reliably seals the organic light emitting device and prevents degradation by permeation of external harmful materials, while providing high flexibility and low manufacturing cost.

10 Claims, 2 Drawing Sheets

FLAT PANEL DISPLAY DEVICE AND MANUFACTURING METHOD FOR THE SAME

This application claims priority to Korean Patent Application No. 10-2006-0010592, filed on Feb. 3, 2006, and all the benefits accruing therefrom under 35 U.S.C. §119, the contents of which in its entirety are herein incorporated by reference.

BACKGROUND OF THE INVENTION

1. Field of the Invention

The present invention relates to a flat panel display device and a manufacturing method for the same, and more particularly to a flat panel display device and a manufacturing method for the same which can reliably seal an organic light emitting device to prevent its degradation caused by permeation of harmful materials, while maintaining high flexibility and low manufacturing cost.

2. Description of the Related Art

FIG. 1 is a cross-sectional view of an organic light emitting device disclosed in U.S. Pat. No. 6,268,695. This organic light emitting device includes a substrate 10, a first cover 50, an organic light emitting diode 20 and a second cover 51. The first and second covers 50 and 51 encapsulate both sides of the organic light emitting diode 20 to prevent the permeation of oxygen and water, which causes oxidation or corrosion. The first and second covers 50 and 51 include a ceramic layer 54 and two polymer layers 52 and 56, which must be laminated in multiple layers to provide sufficient barrier properties against harmful materials.

The ceramic layer 54 is an effective barrier to harmful materials, but is easily deformed by internal stress, and is likely to have defects such as cracks caused during laminating. Also, the ceramic layer 54 is easily cracked by deformation during use. Defects provide a permeation path for harmful materials, which then react with the organic light emitting diode 20 to form a dark spot where display function is lost, thereby deteriorating the display capability and life span of the display.

The ceramic layer 54 and the polymer layers 52 and 56 of the first cover 50 and the second cover 51 are laminated onto the preceding layer by vacuum evaporation. However, vacuum evaporation is a special process requiring expensive equipment, skilled operators, and is very time consuming. Thus, achieving a good barrier comes at the cost of low productivity and a lengthy and expensive process. Therefore, it is necessary to provide a sealing technique to provide a good barrier for the organic light emitting diode and which uses an easier laminating process.

BRIEF SUMMARY OF THE INVENTION

The present invention provides a flat panel display device and a manufacturing method for the same, which can reliably seal an organic light emitting device and prevent degradation by permeation of external harmful materials, while providing high flexibility and low manufacturing cost.

According to an aspect of the present invention, there is provided an exemplary embodiment of a flat panel display device comprising a substrate, an organic light emitting diode formed on the substrate, an inner stack encapsulating the emitting diode and comprising at least one organic layer and one inorganic layer, and an outer stack deposited to cover the inner stack and comprising at least two polymer layers and an adhesive layer disposed therebetween to combine the at least two polymer layers and a polymer heat-curing film disposed at an interface of the polymer layers and the adhesive and bonding layer and cured by heat treatment.

The inner stack comprises an organic layer contacting the organic light emitting diode and an inorganic layer laminated onto the organic layer. The polymer layer and the adhesive and bonding layer are deposited on a preceding layer of another polymer layer and adhesive and bonding layer by a laminating process, and the polymer layer and the adhesive and bonding layer are deposited on the preceding layer by spaying a raw material paste through a spray nozzle or by screen printing.

The polymer layer may be made of polyolefin or a blend of polyolefin and an additional element, or ethylene unsaturated ester copolymer, or polyethylene.

The adhesive and bonding layer may be made of a mixture of polyester and nylon, and the adhesive and bonding layer and the polymer layer contacting each other are fused through heat treatment and bonded to each other.

The polymer heat-curing film is formed by performing a corona discharge process on the polymer layer.

The organic layer may be made of a polymeric resin material such as acrylic, methacrylic, polyester, PET, polyethylene, or polypropylene, and the inorganic layer may be made of $In_2O_3$, $SnO_2$, ITO, $SiO_2$, $Al_2O_3$, $TiO_2$, AlN, SiN, SiC, or SiON.

According to another aspect of the present invention, there is provided a manufacturing method of a flat panel display device, comprising: forming an organic light emitting diode on an substrate; forming an inner stack by laminating an organic layer and an inorganic layer to encapsulate the light emitting diode; depositing a first polymer layer and an adhesive and bonding layer successively to cover the inner stack, and forming a polymer heat-curing film at a first interface of the first polymer layer by heat treatment; and depositing a second polymer layer on the adhesive and bonding layer and forming a polymer heat-curing film at a second interface of the second polymer layer by heat treatment.

The heat treatment is done by performing a corona discharge process on the polymer layer.

The manufacturing method of flat panel display device further comprises depositing a second adhesive and bonding layer and a third polymer layer on the second polymer layer after forming the polymer heat-curing film at the second interface of the second polymer layer, and forming a polymer heat-curing film at a third interface of the third polymer layer by heat treatment.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1:
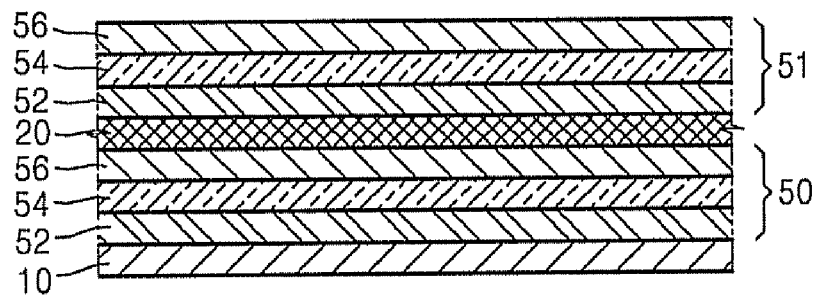
FIG. 1 is a cross-sectional view of the conventional organic light emitting device.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in more detail by explaining exemplary embodiments of the present invention with reference to the attached drawings.

Figure 2:
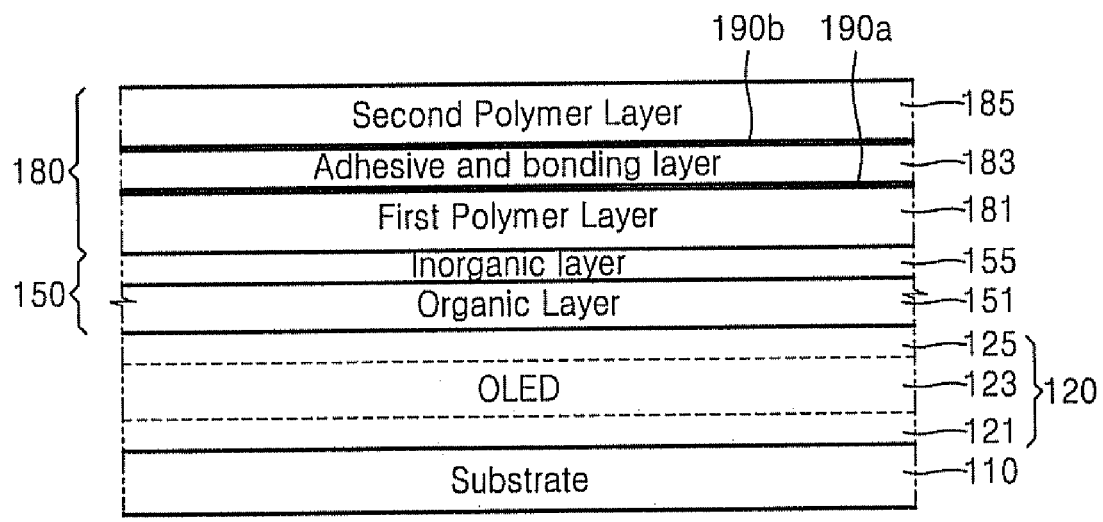
FIG. 2 is a cross sectional view of an exemplary embodiment of a flat panel display device according to the present invention.

FIG. 2 is a cross-sectional view of an organic light emitting device as an exemplary embodiment of a flat panel display device according to the present invention. The flat panel display device includes a substrate 110 of glass or plastic and an organic light emitting diode 120 formed on the substrate 110, and has a multiple layered structure for sealing the organic light emitting diode 120 to exclude permeation of harmful materials. The substrate 110 may be made of transparent or semi-transparent glass or flexible plastic panel such as polyethylene terephthalate ("PET"), polycarbonate, for example.

The organic light emitting diode 120 displays an image by emitting red, green and blue light, and includes a first electrode layer 121 as an anode injecting holes, a second electrode layer 125 as a cathode injecting electrons, and an organic layer 123 having an emission area and arranged between the first and second electrode layers 121 and 125. The first electrode layer 121 is formed of a material having a high work function, for example, a transparent electrode material such as indium tin oxide ("ITO").

The organic layer 123 formed on the first electrode layer 121 may be made of a low molecule polymer or high polymer organic layer. The low molecule polymer film may be formed by laminating a hole injection layer ("HIL"), a hole transport layer ("HTL"), an emission layer ("EML"), an electron transport layer ("ETL") and an electron injection layer ("EIL"), or a combination comprising at least one of the foregoing. The high molecule polymer film may be formed of a HTL and an EML. The structure of the organic layer 123 is not limited to the above, and may be constructed in a single layer of an organic EML or may be constructed in two layers of a HTL and an organic EML or in two layers of an organic EML and an ETL. The second electrode layer 125 functions as a cathode and may be formed of a metal having low work function, preferably Ca, Ba, Mg/Ag, Mg, Al or an alloy comprising at least one of the foregoing, by evaporation.

In the organic light emitting diode 120, when a voltage is applied to the first electrode layer 121 and the second electrode layer 125, which are biased to be an anode and a cathode, respectively, holes injected from the first electrode layer 121 and electrons injected from the second electrode layer 125 are recombined in the organic layer 123 causing an energy level to drop from an excited level, and emitting a wavelength of light corresponding to the energy difference.

The multiple layered sealing structure to protect the organic emission layer 120 from harmful materials is divided into an inner stack 150 and an outer stack 180. The inner stack 150 includes an organic layer 151 and an inorganic layer 155 alternately laminated. As long as the organic and inorganic layers 151 and 155 are alternately arranged, they may be stacked as many times as desired. However, because a special process, such as vacuum evaporation, is required to make the inner stack 150 of organic and inorganic layers 151 and 155, it is desirable to limit the stacking to as few layers as possible, in consideration of easy manufacture. For example, as shown in the figure, the inner stack 150 may consist of one organic layer 151 and one inorganic layer 155 laminated on the organic layer 151, which is sufficient because the barrier to harmful materials is achieved by the outer stack 180 described more fully below.

The organic layer 151 attached to the organic light emitting diode 120 absorbs external impact by a special buffering property derived from its material, to protect the organic light emitting diode 120 from external impact. The organic layer 151 may be made of polymeric resin material such as acrylic, methacrylic, polyester, PET, polyethylene, or polypropylene. The inorganic layer 155 of the inner stack 150 is formed on the organic layer 151 and prevents the permeation of external harmful materials such as oxygen and moisture. The inorganic layer 155 may be made of $In_2O_3$, $SnO_2$, ITO, $SiO_2$, $Al_2O_3$, $TiO_2$, AlN, SiN, SiC, SiON, for example. The organic and inorganic layers 151 and 155 may be formed on the organic light emitting diode 120 by vacuum evaporation.

The outer stack 180 includes at least two polymer layers 181 and 185 bonded together by an adhesive and bonding layer 183 therebetween. The polymer layers 181 and 185 may be made of a blend of polyolefin and other functional elements, or ethylene, unsaturated ester copolymer, polyethylene, for example. The adhesive and bonding layer 183 may be made of a general adhesive material, and for example, may be made of a mixture of polyester and nylon.

The polymer layers 181 and 185 and the adhesive and bonding layer 183 of the outer stack 180 may be deposited by a common laminating method. The common laminating method includes an application method generally and easily performed except for a vacuum evaporation method. The common laminating method may also include a special film forming method, for example, spraying material paste from a spray nozzle and curing it at high temperature, or screen printing.

Polymer heat curing films 190a and 190b are formed between the opposite contacting polymer layers 181 and 185, respectively. and the heat curing films 190a and 190b have a special curing structure to contribute to the barrier of harmful materials.

The manufacturing method of the polymer heat-curing films 190a and 190b is as follows.

Figure 3:
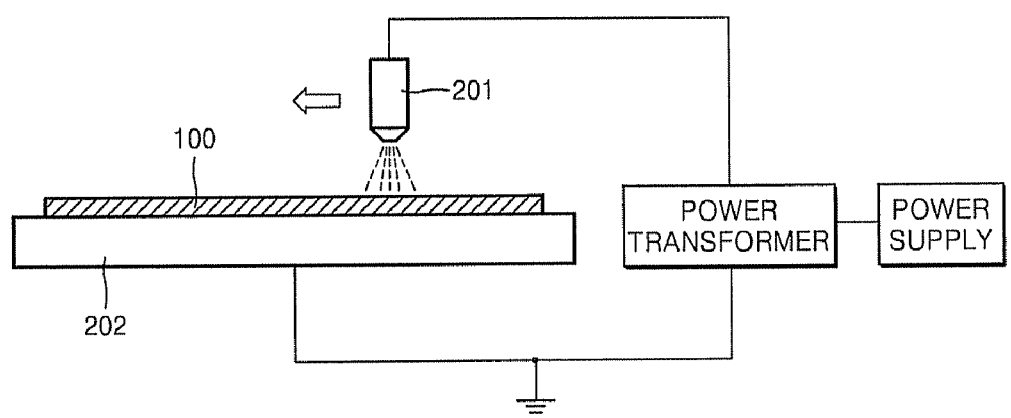
FIG. 3 is a schematic view explaining the corona discharge process applied to exemplary embodiments of the present invention.

First, the adhesive and bonding layer 183 is deposited on the first polymer layer 181, and the polymer layer 181 is heat treated to improve its surface properties. The heat treatment may be surface treatment by corona discharge. FIG. 3 is a schematic view explaining the corona discharge process. In the corona discharge process, a layer 100 to be treated is located between a rod type electrode 201 and a plate type electrode 202 opposite to the rod electrode 201. A high frequency alternating current is output from a power supply and transformed to a high voltage by a power transformer to generate a corona discharge between the electrodes 201 and 202. The heat generated at this time fuses the interface of the polymer layer 181 and the adhesive and bonding layer 183 to improve their adhesive strength. Especially, by a curing action of the polymer layers 181, a cured polymer layer 190a is produced at the interface of the adhesive and bonding layer 183. The cured polymer layer 190a has a cured structure so as to block permeation of external harmful materials.

Next, the second polymer layer 185 is deposited on the adhesive and bonding layer 183, preferably by the common laminating process in consideration of convenience of manufacture. After depositing the second polymer layer 185, the corona discharge process is performed on the second polymer layer 185. At this time, it is preferable that the heat of discharge is uniformly transferred to the whole surface of the second polymer layer 185. The adhesive and bonding layer 183 and the second polymer layer 185 contacting the adhesive and bonding layer 183 are locally fused by the corona discharge process, bonding the two layers securely to each other, and a polymer heat-curing film 190b is generated at the interface of the second polymer layer 185 by a curing reaction. The polymer heat-curing film 190b is obtained by heat transformation of the polymer material, and has a dense inner structure so as to block external permeation of harmful materials such as moisture/oxygen.

In the present invention, the polymer heat-curing films 190a and 190b are formed by heat treating the polymer layers 181 and 185, and the polymer heat-curing films 190a and 190b contribute to excluding harmful materials. The barrier to harmful materials is not realized through a conventional ceramic material but through the flexible polymer layers 181 and 185, and avoids cracks and other defects due to the brittle ceramic material. The organic light emitting diode 120 may be reliably sealed, thereby providing a reliable flat panel display with good flexibility.

Figure 4:
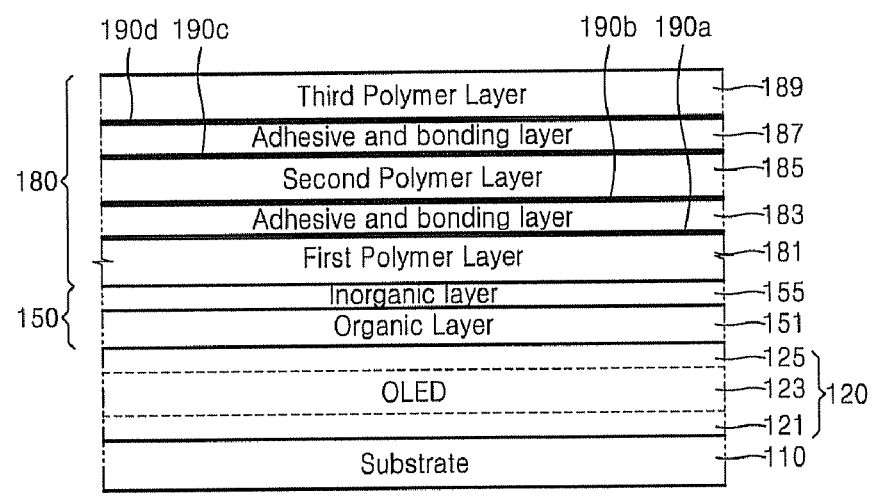
FIG. 4 is a cross-sectional view of another exemplary embodiment of a flat panel display device according to the present invention.

FIG. 4 is a cross-sectional view of another exemplary embodiment of a flat panel display device according to the present invention. As shown in FIG. 4, an organic light emitting diode 120 as an emission element and an inner stack 150 as well as an outer stack 180 as a barrier to harmful materials are successively laminated on an substrate 110. The inner stack 150 includes an organic layer 151 contacting the organic light emitting diode 120 directly, and an inorganic layer 155 deposited on the organic layer 151. In this exemplary embodiment, the outer stack 180 includes three polymer layers 181, 185 and 189, and adhesive and bonding layers 183 and 187 are located respectively between the polymer layers 181, 185 and 189 to combine them.

Polymer heat-curing films 190a, 190b, 190c and 190d are formed at each interface between the polymer layers 181, 185 and 189 and the adhesive and bonding layers 183 and 187, the polymer heat-curing layers 190a, 190b, 190c and 190d are produced by the curing reaction generated by heat treatment. As was explained above, after the first polymer layer 181 and the adhesive 183 are successively deposited on the inner stack 150, the polymer heat-curing film 190a is formed at the interface of the first polymer layer 181 and the adhesive and bonding layer 183 by heat treatment. Next, after the second polymer layer 185 is deposited on the adhesive and bonding layer 183, the polymer heat-curing film 190b is formed at the interface of the second polymer layer 185 and the adhesive and bonding layer 183 by heat treatment. Similar to the above description, the polymer heat-curing films 190c and 190d are successively formed, respectively at the interface of the second polymer layer 185 and the adhesive and bonding layer 187, and the adhesive and bonding layer 187 and the third polymer layer 189. It is desirable that each of the polymer layers 181, 185 and 189 and the adhesive and bonding layers 183 and 187 is deposited by a common laminating method for convenience of manufacture, and the polymer heat-curing films 190a, 190b, 190c and 190d may be formed by corona discharge. In this exemplary embodiment, increasing the number times that the polymer layers 181, 185 and 189 are laminated and forming the polymer heat-curing films 190a, 190b, 190c and 190d which are transformed to the cured structure to effectively block oxygen and moisture may improve the barrier characteristics. Thus, the inner films of the organic light emitting diode 120, which are susceptible to oxidization and corrosion, may be reliably sealed and protected from harmful materials.

According to the present invention, almost all of the barrier structure is formed by the easily executed laminating process, except for the special forming process such as vacuum evaporation, and the number of insulating films requiring the special forming process is minimized, so that the product-yield rate is improved and the manufacturing cost is greatly reduced.

The polymer heat-curing film obtained by heat treating the polymer layer has the cured structure which is suitable for effectively blocking external harmful materials such as oxygen and moisture, providing improved barrier characteristics. Instead of a conventional brittle ceramic material carrying out the barrier function, the flexible polymer layer in the present invention has a barrier function, so that a flexible, deformable display device may be provided. Also, the organic light emitting device may be protected by the reliable and flexible sealing avoiding defects such as cracks.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flat panel display device comprising:
    a substrate;
    an organic light emitting diode formed on the substrate;
    an inner stack encapsulating the light emitting diode and comprising at least one organic layer and one inorganic layer alternately stacked; and
    an outer stack deposited to cover the inner stack and comprising at least two polymer layers and an adhesive and bonding layer disposed therebetween to combine the at least two polymer layers and a polymer heat-curing film disposed at an interface of the polymer layers and the adhesive and bonding layer and cured by heat treatment.

2. The flat panel display device of claim 1, wherein the inner stack comprises an organic layer contacting the organic light emitting diode and an inorganic layer laminated onto the organic layer.

3. The flat panel display device of claim 1, wherein the polymer layer and the adhesive and bonding layer are deposited respectively on a preceding layer of another polymer layer and the adhesive and bonding layer by a laminating process.

4. The flat panel display device of claim 3, wherein the polymer layer and the adhesive and bonding layer are deposited on the preceding layer by spraying a raw material paste through a spray nozzle.

5. The flat panel display device of claim 3, wherein the polymer layer and the adhesive and bonding layer are deposited on the preceding layer by screen printing.

6. The flat panel display device of claim 1, wherein the polymer layer may be made of polyolefin or a blend of polyolefin and an additional element, or ethylene unsaturated ester copolymer, or polyethylene.

7. The flat panel display device of claim 1, wherein the adhesive and bonding layer may be made of a mixture of polyester and nylon, and the adhesive and bonding layer and the polymer layer contacting each other are fused through heat treatment and bonded to each other.

8. The flat panel display device of claim 1, wherein the polymer heat-curing film is formed by performing a corona discharge process on the polymer layer.

9. The flat panel display device of claim 1, wherein the organic layer may be made of a polymeric resin material such as acrylic, methacrylic, polyester, PET, polyethylene, or polypropylene.

10. The flat panel display device of claim 1, wherein the inorganic layer may be made of a ceramic material selected from $In^2O^3$, $SnO^2$, ITO, $SiO^2$, $Al^2O^3$, $TiO^2$, AlN, SiN, SiC, or SiON.

* * * * *